United States Patent [19]
Ma

[11] Patent Number: 5,400,998
[45] Date of Patent: Mar. 28, 1995

[54] STAND FOR AUDIO COMPONENTS

[76] Inventor: Tit-Chung Ma, 50 Highbridge Place, Scarborough, Ontario, Canada, M1V 4R8

[21] Appl. No.: 778,896
[22] PCT Filed: Jul. 5, 1990
[86] PCT No.: PCT/CA90/00214
   § 371 Date: Jan. 13, 1992
   § 102(e) Date: Jan. 13, 1992
[87] PCT Pub. No.: WO91/00682
   PCT Pub. Date: Jan. 10, 1991

[30] Foreign Application Priority Data
   Jul. 5, 1989 [CA] Canada ................. 604865

[51] Int. Cl.6 ............................................. F16M 13/00
[52] U.S. Cl. ............................ 248/615; 248/188.9; 248/677
[58] Field of Search ............... 248/632, 633, 677, 688, 248/188.8, 188.9, 615; D15/199; D99/99

[56] References Cited
U.S. PATENT DOCUMENTS

| | | | |
|---|---|---|---|
| 101,648 | 4/1870 | Moses | 248/188.9 |
| 768,680 | 8/1904 | Norwood | 248/188.9 |
| 1,570,564 | 1/1926 | Hamel | 248/188.8 X |
| 1,664,521 | 4/1928 | Mayette | 248/188.9 X |
| 2,281,136 | 4/1942 | Beverlin | 248/188.8 X |
| 2,670,914 | 3/1954 | Jones | 248/188.9 |
| 3,337,167 | 8/1967 | Johnson | 248/188.9 X |
| 4,718,631 | 1/1988 | Reynolds et al. | 248/677 |

FOREIGN PATENT DOCUMENTS

| | | | |
|---|---|---|---|
| 31536 | 3/1981 | Japan | 248/188.8 |
| 140136 | 6/1988 | Japan | 248/188.8 |

OTHER PUBLICATIONS

IBM Technical Disclosure Bulletin, vol. 19, No. 9, Feb., 1977, New York US p. 3448 C. P. Baechtle: "Staple foot".
NL,C,81302 (N.V. Philips' Gloeilampenfabrieken) 15 Nov. 1955.

*Primary Examiner*—J. Franklin Foss

[57]  ABSTRACT

A tray (1–8) for inserting a memory card into a portable computer is described. The tray (1–8) facilitates complete insertion of the memory card into the computer and optimum electrical interconnection between the memory card and the computer interior. The tray (1–8) is dimensioned such that it creates a tight seal with the computer housing and provides a coplanar fit with the exterior of the computer housing. No portions of the tray (1–8) or memory card protrude beyond the computer housing, thereby improving the durability, maneuverability, and compactness of the portable computer. A stop mechanism (4, 7) restrains the tray within the housing when the tray (1–8) is opened. A memory card can easily be placed thereinto or removed therefrom when the tray (1–8) is opened and yet the tray (1–8) does not become separated from the computer and lost.

8 Claims, 1 Drawing Sheet

STAND FOR AUDIO COMPONENTS

FIELD OF THE INVENTION

The present invention relates to stands for enhancing performance of audio components and in particular enhancing performance of audio amplifiers.

BACKGROUND OF THE INVENTION

Presently, stands are used for a number of components of home audio systems particularly, with turntables and speakers to act as isolation devices for isolating the components from vibration. It has been thought that certain of the components such as amplifier or receivers are not directly affected by vibration or other interference and hence, it has been thought that it was not necessary to provide for isolation devices for such components.

SUMMARY OF THE INVENTION

The present invention provides a stand for enhancing performance of an audio component. The stand comprises a hollow body having a supporting base and tapering upwardly inwardly from the supporting base to a top seating surface for the audio component. The stand is made from an insulating material for isolating the audio component from the surface on which it is supported through the stand.

BRIEF DESCRIPTION OF THE DRAWINGS

The above as well as other advantages and features of the present invention will be described in greater detail according to the preferred embodiments of the present invention in which.

DETAILED DESCRIPTION ACCORDING TO THE PREFERRED EMBODIMENTS OF THE PRESENT INVENTION

Figure 1:
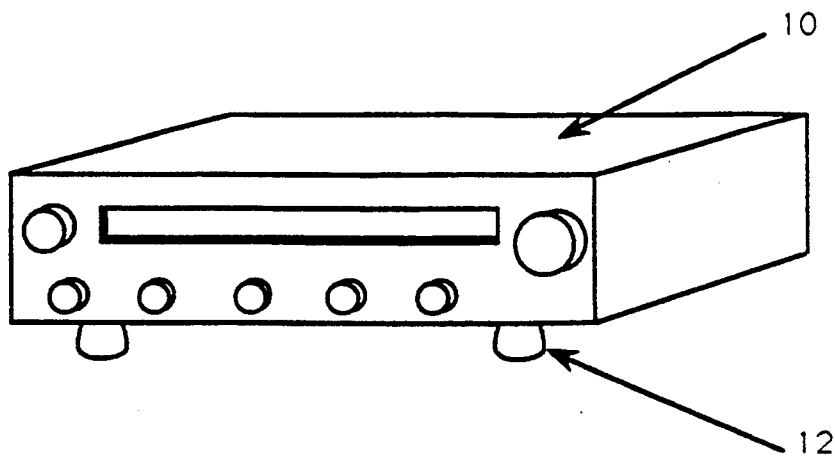
FIG. 1 is a perspective view of an amplifier supported by a plurality of stands each of which is made in accordance with a preferred embodiment of the present invention.

FIG. 1 illustrates a typical audio amplifier 10 supported by a plurality of audio stands 12 made in accordance with a preferred embodiment of the present invention. Because these stands are relatively small and positioned at spot locations, typically a number of stands, only two of which can be seen in FIG. 1, are used to support the amplifier.

The stands are a height, e.g. preferably from about 1 to 5 inches most preferably from about 1.5 to 3.5 inches, to effectively lift the amplifier from the supporting surface on which the stands themselves are placed while maintaining stability of the amplifier.

Each of these stands has the function of lifting the amplifier off of the supporting surface on which the amplifier would otherwise rest. This supporting surface is subject to different conditions such as the transmission of electrical signals, heat buildup, etc. which pass through the supporting surface. This is true even when the supporting surface is made from a material with low conductivity properties and normally the amplifier would sit with its entire bottom surface on or immediately next to the supporting surface where the amplifier would be subject to any transmissions flowing through the supporting surface. These transmissions then adversely affect performance of the amplifier.

Figure 3:
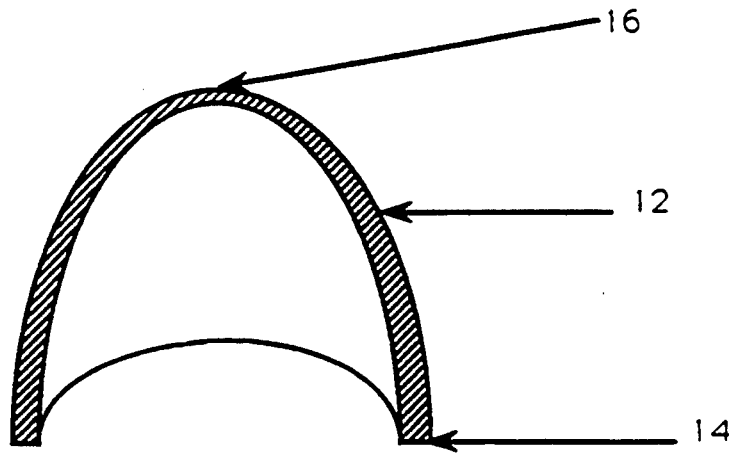
FIG. 3 is a sectional view of the stand of FIG. 2.

However, in accordance with the present invention, the amplifier is lifted off of and isolated from the supporting surface by the stands 12. The stands themselves have a hollow construction and present only a relatively thin lower edge 14 forming the base of the stands. This thin lower edge, in combination with the small size of the stand, ensures a very small surface or transmission area through the stand to effectively block transmissions from the supporting surface to the amplifier. In addition, each of the stands has an upward inward taper with an actual thinning of the material upwardly through the stand as best seen in FIG. 3 of the drawings to provide a sink effect restricting the flow of any adverse transmissions upwardly along the stand. The stand then terminates in a top surface 16 which as again seen in FIG. 3 of the drawings has a very small surface area for contact with the amplifier. This again enhances the isolation of the amplifier through the stand relative to the supporting surface.

In the preferred embodiment of the invention as shown, stand 12 has a hollow slightly truncated hemispherical shape. However, it is to be appreciated that other shapes such as a truncated cone would also provide an upward inward taper to the stand.

With respect to the material used in forming the stand, porcelain has particularly good insulation properties for minimizing conductivity from the supporting surface through the stand to the amplifier. However, once again it is to be appreciated that other insulating materials can be used in constructing the stand.

All of the description above relates to the audio stand as having an upwardly inwardly tapering shape from the support base to a top seating surface. According to a further aspect of the present invention, the audio stand has a downwardly inwardly tapering configuration from a small supporting base to a larger top seating surface. In other words, the shape of the audio stand is identical to that shown in FIGS. 2 and 3 except that it reverses in position whereby the one end 14 becomes the top seating surface and the other end 16 becomes the base for the support. In this embodiment, the base, i.e. end 16, presents a very small pickup area to again effectively block transmissions from the supporting surface to the amplifier. The top seating surface, i.e., end 14, presents only a relatively thin edge at the base of the amplifier so that it also acts to isolate the amplifier from the supporting surface.

Figure 2:
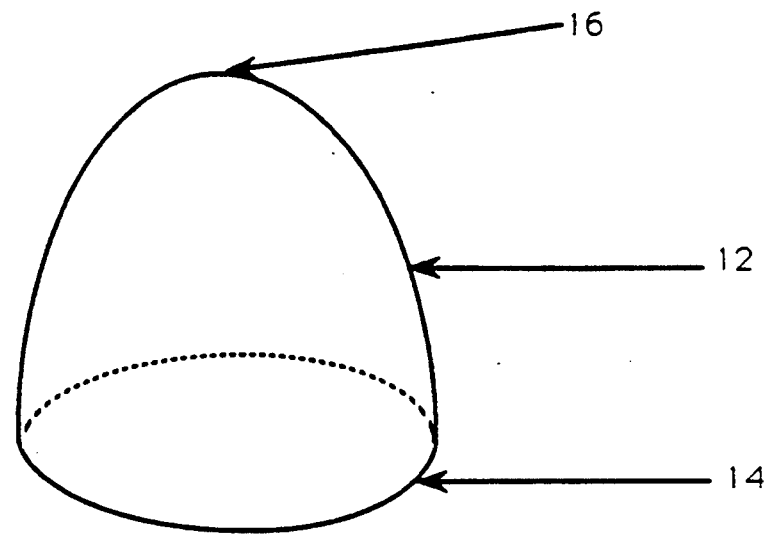
FIG. 2 is a perspective view of one of the stands used in FIG. 1.

In summary, the audio stand can either be used in the upwardly inwardly tapering directin as shown in FIGS. 2 and 3 of the drawings or it can be reversed 180° from the FIGS. 2 and 3 position.

It will now be seen how in accordance with the present invention, an audio component supporting stand, although extremely simple in its construction is very effective for isolation and enhancing performance of an audio component. Furthermore, although various preferred embodiments of the invention have been described in detail, it will be appreciated by those skilled in the art that variations may be made without departing from the spirit of the invention or the scope of the appended claims.

The embodiments of the invention in which an exclusive property or privilege is claimed are defined as follows:

1. A stand for an audio component, said stand comprising a hollow body having a supporting base and tapering upwardly inwardly from said supporting base to a top seating surface for the amplifier, said stand being made from a hard, inelastic insulating material for isolating the component from a supporting surface on which the component is supported by said stand.

2. A stand for an audio amplifier, said stand comprising a hollow body having a supporting base and tapering upwardly inwardly form said supporting base to a top seating surface for the amplifier, said stand being made from a hard, inelastic insulating material for isolating the amplifier from a supporting surface on which the amplifier is supported by said stand.

3. A stand for an audio amplifier as claimed in claim 2, being made from porcelain.

4. A stand for an audio amplifier as claimed in claim 2, having a hemispherical shape.

5. A stand for an audio amplifier as claimed in claim 2, having a truncated hemispherical shape.

6. A stand for an audio amplifier as claimed in claim 2, having a conical shape.

7. A stand for an audio component, said stand comprising a hollow body having first and second ends, said first end being of increased diameter relative to second end, said hollow body tapering inwardly from said first to said second end, and said stand being made from a hard, inelastic insulating material for isolating the component from a supporting surface on which the component is supported by said stand.

8. A stand as claimed in claim 7, wherein said second end forms a base and said first end forms a top seating surface on said stand, said stand tapering upwardly outwardly from said base to said top seating surface.

* * * * *